United States Patent [19]

Glover et al.

[11] Patent Number: 4,731,583

[45] Date of Patent: Mar. 15, 1988

[54] METHOD FOR REDUCTION OF MR IMAGE ARTIFACTS DUE TO FLOWING NUCLEI BY GRADIENT MOMENT NULLING

[75] Inventors: Gary H. Glover, Oconomowoc, Wis.; Matthew O'Donnell, Schenectady, N.Y.

[73] Assignee: General Electric Company, Milwaukee, Wis.

[21] Appl. No.: 798,544

[22] Filed: Nov. 15, 1985

[51] Int. Cl.$^4$ ............................................. G01R 33/20
[52] U.S. Cl. ..................................... 324/309; 324/314
[58] Field of Search ............... 324/309, 314, 306, 307; 128/653

[56] References Cited

U.S. PATENT DOCUMENTS

| | | | |
|---|---|---|---|
| 4,431,968 | 2/1984 | Edelstein et al. | 324/309 |
| 4,595,879 | 6/1986 | Lent et al. | 324/309 |
| 4,616,180 | 10/1986 | Compton | 324/309 |
| 4,629,988 | 12/1986 | Bottomley | 324/309 |
| 4,663,591 | 5/1987 | Pelc et al. | 324/309 |

Primary Examiner—Tom Noland
Attorney, Agent, or Firm—Mark L. Mollon; Douglas E. Stoner

[57] ABSTRACT

A technique has been developed which reduces blood-flow artifacts in multi-echo, multi-slice magnetic resonance (MR) imaging by rephasing spins which have arbitrary velocity as well as static spins. The technique requires tailoring of the gradient structure along at least one of the three axes so as to null out in the preferred embodiment the zeroth and first moments of the gradient distributions.

9 Claims, 4 Drawing Figures

METHOD FOR REDUCTION OF MR IMAGE ARTIFACTS DUE TO FLOWING NUCLEI BY GRADIENT MOMENT NULLING

BACKGROUND OF THE INVENTION

This invention relates to magnetic resonance (MR) methods. More specifically, this invention relates to a method for reduction of image artifacts from flowing nuclei caused by random phase accumulation in gradients by appropriate choice of magnetic field gradient flow compensation pulses.

The magnetic resonance phenomenon has been utilized in the past in high resolution magnetic resonance spectroscopy instruments by structural chemists to analyze the structure of chemical compositions. More recently, MR has been developed as a medical diagnostic modality having applications in imaging the anatomy, as well as in performing in vivo, noninvasive spectroscopic analysis. As is now well known, the MR phenomenon can be excited within a sample object, such as a human patient, positioned in a homogeneous polarizing magnetic field, by irradiating the object with radio frequency (RF) energy at the Larmor frequency. In medical diagnostic applications, this is typically accomplished by positioning the patient to be examined in the field of an RF coil having a cylindrical geometry, and energizing the RF coil with an RF power amplifier. Upon cessation of the RF excitation, the same or different RF coil is used to detect the MR signals, frequently in the form of spin echoes, emanating from the patient volume lying within the field of the RF coil. In the course of a complete MR scan, a plurality of MR signals are typically observed. The signals are used to derive MR imaging or spectroscopic information about the object studied.

In typical studies, the MR signal is usually observed in the presence of pulsed linear magnetic field gradients used to encode spatial information into the signal. Pulsed magnetic field gradients are also employed with selective RF pulses (for example, 90° and 180° pulses) to excite nuclear spins in predetermined regions of the object undergoing examination. In the course of an MR examination, it is frequently desirable to apply pulsed magnetic field gradients $G_x$, $G_y$ and $G_z$ in each of the x, y, and z directions, respectively, of a conventional Cartesian coordinate system. It will be recognized, however, that in practice the direction in which magnetic field gradient pulses may be applied is not limited in any manner, and any direction could be selected as required.

It has been found that artifacts from blood flow are one of the serious image defects in MR imaging of abdominal and chest fields. The artifacts are manifested as high-spatial frequency random streaks in the phase-encoding direction (when using a Fourier transform imaging method, such as spin warp) and emanate from the aorta, heart, and other regions where high volume of blood flow occurs. Often the streaks obscure the anatomical presentation and can render portions of the image useless.

Such streaking artifacts have been found by Applicants to stem from amplitude and phase variations in the measured spin-echo signal which are uncorrelated from view to view. These signal variations in turn can be traced to flow velocity fluctuations together with one or more of the following mechanisms depending on the pulse sequence: 1. Time-of-flight variations between selective pulses; 2. Phase distortion by selective 180° RF pulses; and 3. Phase accumulation of moving spins in a gradient.

It is a principal object of the present invention to provide a method for reduction of artifacts caused by phase accumulation errors of moving spins in a gradient.

SUMMARY OF THE INVENTION

A method is provided for compensating for random phase accumulations in magnetic resonance signals acquired from a region of an object having stationary and flowing nuclear spins. The method includes the implementation of a plurality of views, each of which includes irradiation of the region by an RF excitation pulse at the Larmor frequency to produce an MR signal, and application along at least one dimensional axis of the region of a pulsed magnetic field gradient having adjustable amplitude and duration parameters. The random phase accumulations, due to fluctuations of flow velocity of said flowing spins from view to view, are compensated by modifying at least one of the amplitude and duration parameters to make at least one of the higher moments of the magnetic field gradient zero.

BRIEF DESCRIPTION OF THE INVENTION

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

It will be beneficial to an intuitive appreciation of how phase accumulation of moving spins occurs in a gradient to initially consider that the nuclear magnetic resonance phenomenon occurs in atomic nuclei having an odd number of protons or neutrons. Due to the spin of the protons and the neutrons, each such nucleus exhibits a net magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$, in which $\gamma$ is the gyromagnetic ratio which is constant for each MR isotope and wherein B is the magnetic field (including $B_o$) acting upon the nuclear spins. It will be thus apparent that the resonant frequency is dependent on the strength of the magnetic field in which the sample is positioned.

Figure 1:
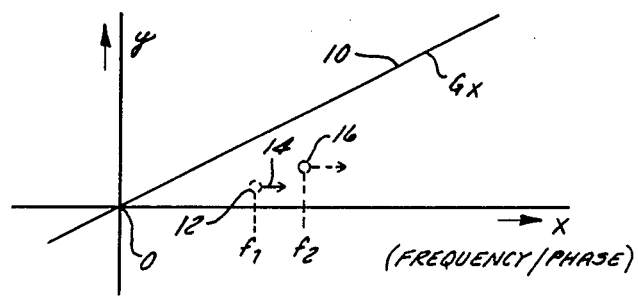
FIG. 1 depicts a gradient in the transverse (x-y) plane and is useful in understanding how phase accumulation of moving spins occurs.

Referring now to FIG. 1, there is shown a gradient in the magnetic field $G_x$ indicated by line 10 in the transverse plane defined by the x and y axes. The $G_x$ gradient defines in accordance with the Larmor equation a unique relationship between precession frequency or phase and position along the x axis. This means that a nuclear spin 12 will have a given precession frequency ($f_1$) which remains constant in time for a stationary spin (assuming other conditions remain unchanged). If, however, the spin moves (due to blood flow, for example) along the direction of the field gradient as indicated by arrow 14, a spin which has moved from 12 to 16 in the course of an MR experiment will have a continuously changing precession frequency during the movement and will end at frequency $f_2$, at its new position along the gradient. The phase accumulated by the spin for a given time interval is related to the time integral of the spin precession frequency over the time interval. Therefore, the terms "phase" and "frequency" are used herein interchangeably. Although the description above is with reference to the x axis, it will be recognized that such effects on frequency and hence phase will occur in all directions in which gradients are applied.

In accordance with the discussion above, it has been known for some time that spins which move along the direction of a field gradient experience a phase accumulation which is directly proportional to the velocity. The interested reader is referred to J. R. Singer, "NMR Diffusion and Flow Measurements and an Introduction to Spin Phase Graphing," J. Phys. E.: Sci. Instr., p. 281 (1978). The Applicants herein have discovered, however, that if the velocity fluctuates from view to view in an imaging pulse sequence, the phase will fluctuate as well and contribute to streak artifacts in the image.

Although the preferred embodiment of the invention will be disclosed with specific reference to a Fourier transform imaging method frequently referred to as spin warp, the invention is not so limited. In general, the invention is applicable to any MR method of acquiring information about an object embodying moving spins in a magnetic field gradient. Without limitation, examples of such methods include two- and three-dimensional embodiments of both Fourier transform (e.g., commonly assigned U.S. Pat. No. 4,431,968, incorporated herein by reference) and multiple angle projection reconstruction imaging, as well as MR spectroscopic methods (such as, for example, disclosed and claimed in commonly assigned U.S. Pat. No. 4,629,988, incorporated herein by reference). In each case, as will be more fully discussed hereinafter, the gradient pulse distribution along at least one axis of an object studied is modified, in accordance with the invention, to make at least some of the higher order magnetic field gradient moments equal zero.

Figure 2:
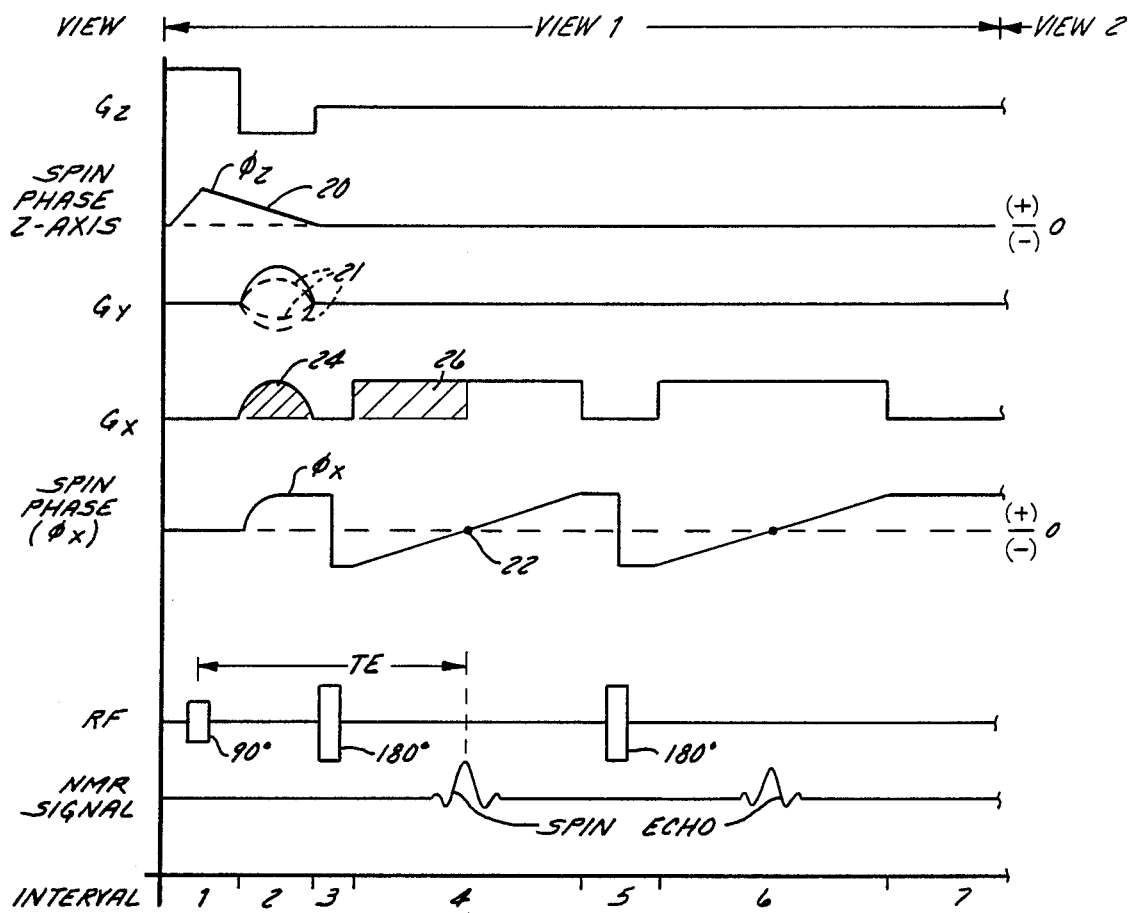
FIG. 2 depicts one exemplary view of a two-echo-spin-warp pulse sequence, including a plot of spin phase in the direction of the x and z axes.

Referring now to FIG. 2, which depicts one view of a conventional two-dimensional spin warp imaging sequence, it will be seen that in interval 1 indicated along the horizontal axis a positive $G_z$ gradient pulse is applied. The direction of the $G_z$ gradient is arbitrarily selected to be in the positive z-axis direction of the Cartesian coordinate system and coincides with the direction of the $B_o$ magnetic field. Also, in interval 1, a selective 90° RF pulse is applied in the presence of the $G_z$ gradient so as to excite nuclear spins in planar volume (not shown) of an object to be examined. The thickness of the selected slice is determined by the amplitude of the $G_z$ gradient and the frequency content of the selective 90° RF pulse. In the preferred embodiments of the invention, the RF pulse is modulated by a sinc function (sin x/x) so as to preferentially excite nuclear spins in an imaging slice having a substantially rectangular profile. The 90° RF pulse and other selective RF pulses can also be modulated with a Gaussian envelope function in which case the profile of the selected slice will be approximately Gaussian.

When the $G_z$ gradient is turned off, the excited nuclear spins precess at the same frequency but are out of phase ($\phi_z$) with one another, due to the dephasing effect of the gradient. Phase coherence of the excited nuclear spins is re-established by the application in interval 2 of, in this case, a negative $G_z$ gradient pulse. Typically, the time integral of the waveform of the $G_z$ gradient over interval 2 required to re-phase the spins is selected to be approximately equal to the negative one half of the time integral of the $G_z$ gradient waveform in interval 1. The rephasing of the spins in the z-axis direction is illustrated by graph 20 from which it will be seen that spin phase, $\phi_z$, is restored to zero at the end of interval 2. Also, during interval 2, a phase-encoding $G_y$ gradient is applied simultaneously with the application of a positive $G_x$ gradient pulse. The $G_y$ gradient has a single peak amplitude during a single exemplary view comprising intervals 1 through 7 of the sequence. However, in each successive view, a different amplitude of the phase-encoding gradient is selected, as suggested by dash curves 21 in FIG. 2. The $G_y$ gradient phase encodes spatial information in the y-axis direction. Each different amplitude of the $G_y$ gradient in subsequent views introduces a different degree of phase encoding. The number of programmable $G_y$ gradient amplitudes is chosen to be equal to the number of pixels (typically 128, 256, 512) the reconstructed image will have in the y-axis direction. It will be recognized that, although the invention is disclosed and claimed with reference to programmable $G_y$ gradient amplitudes, since it is the time integral of the gradient waveform over the interval of the pulse that is important, phase encoding can also be achieved by varying the amplitude and/or duration of the phase-encoding gradient.

The effect of the $G_x$ gradient pulse in interval 2 is to dephase the nuclear spins by a predetermined amount such that, when a nonselective 180° RF pulse (in the conventional spin-warp sequence) is applied in interval 3, a spin-echo signal will be produced in interval 4 at a time TE following the 90° RF pulse. The time of occurrence of the spin-echo signal is determined by the intensity of the $G_x$ gradient applied in interval 2, as well as the intensity of the linear $G_x$ gradient applied in interval 4. In general, a spin echo will occur at a point in time when the spin phases (for both stationary and moving spins) in all gradient directions (x, y and z, in this example) revert to zero. This is indicated at point 22 in FIG. 2 for the phase, $\phi_x$, in the direction of the x axis. In the x-axis direction, assuming all spins are stationary, this is achieved by selecting $G_x$ gradient pulses such that the time integral for the pulse in interval 2 (shaded area 24) is equal to the time integral for the gradient in interval 4 (shaded area 26). Spatial information is encoded in the x-axis direction by the $G_x$ gradient causing the nuclear spins to resonate at frequencies characteristic of their locations with respect to the x axis, as described above with reference to FIG. 1. The spin-echo signal is sampled in interval 4 a number of times which is typically equal to the number of pixels (typically 128, 256, 512) the reconstructed image will have in the x-axis direction. In a well-known manner a second spin-echo signal in interval 6 may be produced in the same view by the application of a 180° RF pulse in interval 5. The image pixel values are obtained from the sampled signals in a well-known manner using a two-dimensional Fourier transform (in the case of two-dimensional Fourier transform scheme).

The mechanism for phase accumulation of moving spins in a gradient will be considered next in greater detail.

In order to examine this mechanism, consider a spin at coordinate $r_\alpha$ ($\alpha = x, y, z$) at time t. Then, the phase, $\phi$, experienced by the spin in a gradient $G_\alpha$ can be represented by a series expansion in time:

$$\phi(t) = \sum_{p=0}^{\infty} \frac{\gamma}{p!} \int_0^t G_\alpha(t')t'^p \frac{d^p r_\alpha}{dt'^p} dt', \quad (1)$$

where the non-zero derivatives of $r_\alpha$ with respect to time characterize the motion of the spin and $\gamma$ is the spin gyromagnetic ratio.

Equation (1) can be rewritten as $$\phi(t) = \sum_{p=0}^{\infty} \phi_p(t), \quad (2)$$

where, $$\phi_p(t) = \frac{\gamma}{p!} \int_0^t G_\alpha(t')t'^p \frac{d^p r_\alpha}{dt'^p} dt'. \quad (3)$$

We now assume that the various position derivatives (e.g., velocity, acceleration, rate of change of acceleration, etc.) are constant during the pulse sequence. Then $$\phi_p = \frac{\gamma}{p!} \frac{d^p r_\alpha(o)}{dt^p} \int_0^t G_\alpha(t')t'^p dt'. \quad (4)$$

It will be recognized that the integral in Equation (4) is the p'th moment of the gradient distribution $G_\alpha(t)$.

Figure 3:
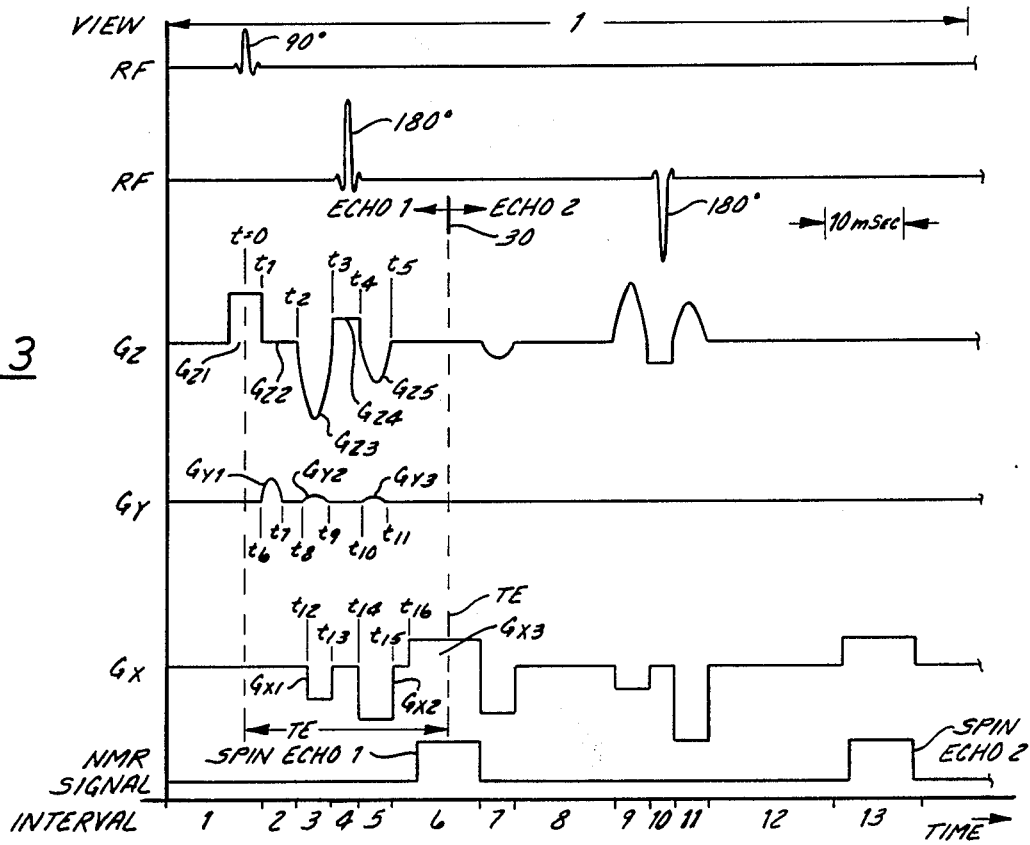
FIG. 3 illustrates one exemplary view of a two-echo-spin-warp pulse sequence, including spin flow compensation in accordance with the invention using gradient moment nulling.

In general, and as alluded to above, for a spin echo to form, all spins must have equal phase. We may conveniently take this phase, as in FIG. 2, to be zero; then from Eq. (2) we require that $\phi_p = 0$ for all p. For stationary spins, this means, for example $$\gamma r_\alpha \int_0^{TE} G_\alpha(t')dt' = \begin{cases} o \text{ if } \alpha \neq y \\ \gamma r_y \int_{t_6}^{t_7} G_y(t')dt', \text{ if } \alpha = y' \end{cases} \quad (5)$$

where TE is the echo time and $t_6$ and $t_7$ define the time interval of the phase-encoding gradient in interval 3 of FIG. 3. It will be recognized that the first condition of Equation (5), when $\alpha \neq y$, must be satisfied in conventional pulse sequences for the stationary spins to rephase so as to produce a spin echo. This is referred to as the correction for the zero'th order moment. Corrections, in accordance with the invention, other than that for the stationary spins shall be referred to herein as higher order correction.

If some of the spins have velocity $dr_\alpha/dt = V_\alpha$ the gradients must also satisfy $$\gamma v_\alpha \cdot \int_0^{TE} G_\alpha(t')t'dt' = 0 \quad (6)$$

in order to rephase the moving spins. This is the correction of the first of the higher order moments. Additional corrections can be implemented for other moments, such as for example, spin acceleration (second order) and rate of change of acceleration (third order). For example, the condition for compensating for the influence of spin acceleration is:

$$\gamma a_\alpha \int_0^{TE} G_\alpha(t')t'^2 dt' = 0, \quad (7)$$

where "a" is spin acceleration. This means, of course, in general, that if all higher moments (greater than zero'th) of the gradient are made zero, then fluctuations in the respective motion components from view to yiew cannot induce phase jitter in the data and thus streak artifacts will not occur from this mechanism. In practice, it has been found that compensation for all motion components is not necessary to achieve reduction in flow artifacts. It has been found, for example, that compensation for the velocity component alone results in significant flow artifact reduction.

The inventive technique of nulling the gradient moments was implemented in a two-echo, multi-slice sequence using a selective 180° RF pulse sequence (TE1=25 msec, TE2=80 msec), one view of which is shown in FIG. 3 with nulling for the zero'th and first order moments. The inventive method is applicable to sequences with more than two spin-echo signals, but is more difficult to implement because of the need to retain ghost suppression techniques such as those disclosed and claimed in the copending applications identified hereinafter. In general, this pulse sequence is similar to that described with reference to FIG. 2. Thus, slice selection is accomplished in interval 1 by the application of a selective 90° RF pulse in the presence of a rectangular $G_z$ gradient pulse. A phase-encoding $G_y$ gradient comprised of one half of a sine wave is applied in interval 2, while selective 180° RF pulses are applied in the presence of rectangular $G_x$ gradient pulses in intervals 4 and 10, the resulting spin-echo signals in intervals 6 and 13 are observed in the presence of linear $G_x$ gradient readout pulses.

Gradient pulses to compensate for phase accumulation of moving spins in a gradient in a manner to satisfy the conditions specified by Equations (5) and (6) are also applied along the x, y and z axes in the pulse sequence of FIG. 3. Gradient pulses to achieve compensation for spin echo 1 are applied to the left of the line identified by numeral 30 in the Figure, while compensation pulses for spin echo 2 are applied to the right. Thus, for spin echo 1, compensating $G_x$, $G_y$ and $G_z$ gradient pulses are applied in intervals 3 and 5. Compensating $G_x$ and $G_z$ gradient pulses for the second spin echo are applied in intervals 7, 9 and 11. It will be seen that in each case the $G_y$ and $G_z$ compensating pulses are in the form of a one-half sine wave, while the $G_x$ compensating pulses are rectangularly shaped. By way of example, for compensation in the $G_z$ direction for spin echo 1 (interval 6) the specific equations equivalent to Equations (5) and (6) are as follows:

$$-G_{z1}t_1 - G_{z2}(t_2 - t_1) - \frac{2}{\pi} G_{z3}(t_3 - t_2) + \frac{2}{\pi} G_{z5}(t_5 - t_4) = 0, \quad (8)$$

$$\frac{-G_{z1}t_1^2}{2} - \frac{G_{z2}}{2}(t_2^2 - t_1^2) - \frac{2}{\pi} \frac{G_{z3}}{2}(t_3^2 - t_2^2) - \quad (9)$$

$$G_{z4}t_3t_4 + \frac{2}{\pi} \frac{G_{z5}}{2}(t_5^2 - t_4^2) = 0.$$

Similarly, for compensation in the $G_y$ gradient direction for spin echo 1 the equations are as follows:

$$-G_{y2}(t_9 - t_8) + G_{y3}(t_{11} - t_{10}) = 0, \quad (10)$$

$$\frac{-G_{y1}}{2}(t_7^2 - t_6^2) - \frac{G_{y2}}{2}(t_9^2 - t_8^2) + \frac{G_{y3}}{2}(t_{11}^2 - t_{10}^2) = 0. \quad (11)$$

For the compensation in the $G_x$ gradient direction:

$$-G_{x1}(t_{13} - t_{12}) + G_{x2}(t_{15} - t_{14}) + G_{x3}(TE - t_{16}) = 0, \quad (12)$$

$$\frac{-G_{x1}}{2}(t_{13}^2 - t_{12}^2) + \frac{G_{x2}}{2}(t_{15}^2 - t_{14}^2) + \frac{G_{x3}}{2}(TE^2 - t_{16}^2) = 0. \quad (13)$$

In Equations (7)–(12) the quantities $G_{\alpha i}$ ($\alpha = x, y, z$, and $i = 1, 2, 3, \ldots$ etc.) refer to the amplitude of the gradient pulse, while $t_j$ ($j = 1, 2, 3, \ldots$ etc.) refers to the starting and ending times of the gradient pulses as indicated in FIG. 3, beginning at $t = 0$. Specific Equations (8), (10) and (12) correspond to Equation (5), while Equations (9), (11) and (13) correspond to Equation (6).

It will be recognized that computer programs may be devised for solving these equations for each axis separately. In solving the equations, it is, in general, desirable to select along each axis, in addition to the gradient pulses present in an unmodified pulse sequence (e.g., $G_z$ for slice selection, $G_y$ for phase encoding, and $G_x$ for readout) two gradient pulses which are unconstrained by imaging requirements and whose parameter values (amplitude and duration) will be determined by the solution of the equations. In practice, the specific values for amplitude and duration are not important since the effect of the gradient on the spins is dependent on the amplitude-duration product (i.e., the area under the gradient pulse waveform). In some pulse sequences the selection of these additional pulses may not be necessary because the conditions of Equations (5) and (6) may be satisfied by adjustment of the amplitude and/or duration values of existing gradient pulses.

Experimental data with the method of the invention were acquired using a flow phantom having four different diameters of tubing arranged in series and having both directions of flow for each. Water doped with copper sulphate ($CuSO_4$) was pumped at a rate rapid enough to ensure that nonlaminar flow occurred even in the largest diameter tubes. The flow rates in the smallest tubing were well over 100 cm/sec, but the exact rates were not measured.

Figure 4:
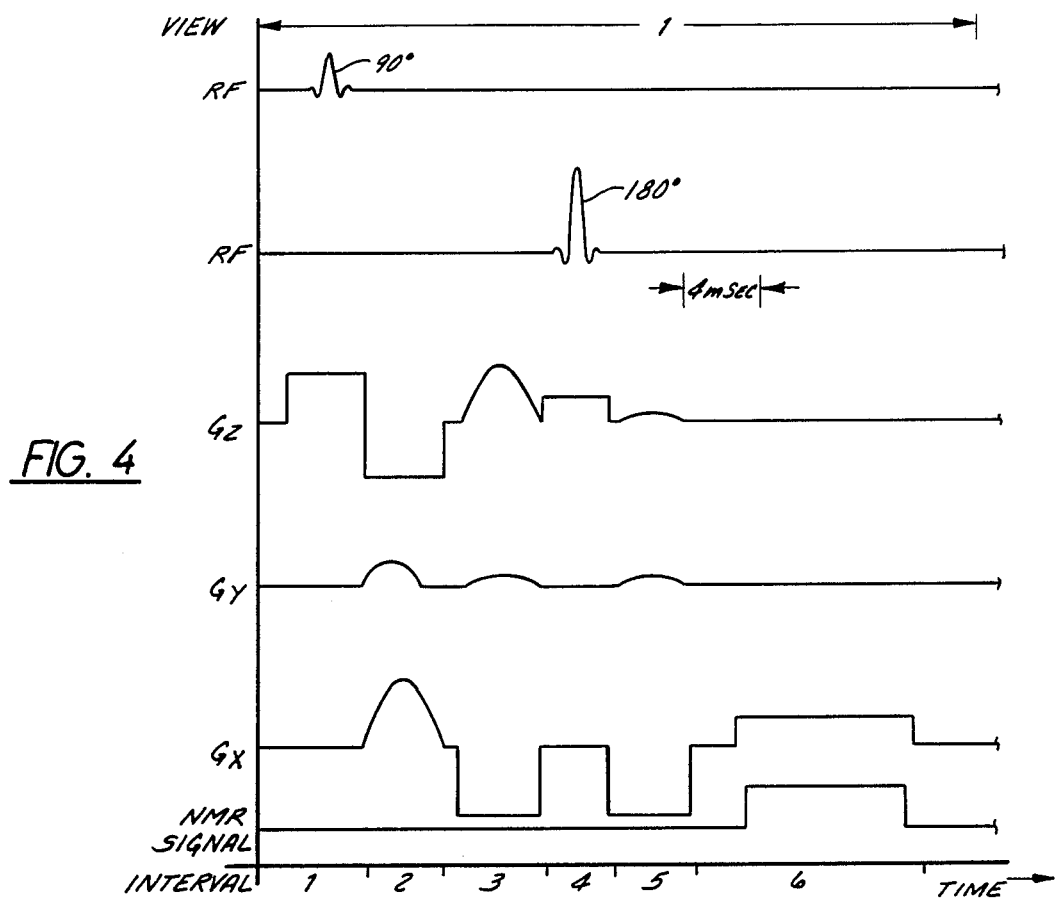
FIG. 4 illustrates one view of a spin warp pulse sequence in which flow compensation is somewhat less effective due to large $G_x$ and $G_z$ magnetic field gradient pulses which occur away from the 180° RF pulse.

Early experiments using the sequence in FIG. 4 with the inventive compensation technique were successful when the 180° RF pulse (interval 4) was not selective, but the compensation was not as effective when the selective gradient was turned on. It was found that the additional phase noise contributed by the 180° RF pulse was the problem. The solution was to remove the long-moment gradient lobes ($G_x$, and $G_z$, interval 2, in FIG. 4) and place the flow compensation pulses as close to the 180° RF pulse as possible as in FIG. 3. When this is done the compensation, even with selective pulses, was found to be satisfactory.

Experiments were also performed to determine in which directions was the compensation required. The experiments were structured so that when the compensation was turned off in a particular direction (x, y or z) the pulse sequence reverted to the conventional one in that axis.

It was found that even though the flow is nominally in the z direction (axis of magnet), both x and z compensation must be utilized to substantially reduce the artifacts. This implies that there is substantial fluctuation in the transverse directions as well as the z direction. Although compensation of the y (phase-encoding) direction does not appear to be as important, this is not because there is less motion or fluctuation of flow velocity in the y direction than the x (readout) direction. The diminished sensitivity results from the fact that there is just one gradient lobe close to the 90° RF pulse in the y axis and therefore there is little evolutionary time for phase errors from y-directed velocity fluctuations to accumulate.

Studies were also performed with human volunteers in both the axial (x-y plane) and sagittal (x-z plane) planes, respectively. The scans were not cardiac gated, but breathing artifacts were reduced using a nonsequential phase-encoding sequence. Such sequences are disclosed and claimed in commonly assigned U.S. patent applications Ser. Nos. 766,733 (now U.S. Pat. No. 4,663,591) and 766,842 which are incorporated herein by reference. The flow artifacts from the aorta and vena cava are significantly reduced and the vessels appeared bright instead of dark when compensation is used. In the sagittal images, the blood (usually not seen in conventional images) was visualized when the compensation is used. The artifact suppression in the second echo at 80 msec was found to be not as good as in the first echo. This is because of time-of-flight errors which are important for the longer time between the two 180° RF pulses.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of compensating for random phase accumulations in magnetic resonance signals acquired from a region of an object having stationary and flowing nuclear spins, said method including the implementation of a plurality of views, each of which includes irradiation of said region by an RF excitation pulse at the Larmor frequency to produce a spin-echo signal at a time TE, and application of a pulsed magnetic field gradient having adjustable amplitude and duration parameters along at least one dimensional axis of said region, said random phase accumulations being due to fluctuations of flow velocity of said flowing spins from view to view, said method comprising the improvement:

modifying at least one of said amplitude and duration parameters so as to make at least one of the higher moments of said magnetic field gradient equal zero by satisfying for said flowing nuclear spins the equation:

$$\gamma v_\alpha \int_o^{TE} G_\alpha(t') \, t' \, dt' = 0$$

where $\alpha = x, y,$ or $z$,
  $v$ is the velocity of nuclear spin flow in the direction of $\alpha$,
  TE is the time occurrence of the spin-echo signal,
  $G_\alpha$ is the gradient in the direction, and
  $\gamma$ is the gyromagnetic ratio.

2. The method of claim 1 further comprising the step of applying at least one magnetic field gradient along a first dimensional axis of said region to encode spatial information into said spin-echo signal in the direction of said first gradient.

3. The method of claim 2 wherein said magnetic field gradient for encoding information is selected to have one of a plurality of directions within said region in the course of implementing said views.

4. The method of claim 3 wherein said gradient for encoding information comprises a resultant magnetic field gradient of the vectorial addition of at least two magnetic field gradients, which gradients are perpendicular to one another within said region.

5. The method of claim 3 wherein said gradient for encoding information comprises a resultant magnetic field gradient of the vectorial addition of a plurality of magnetic field gradients at least one of which is not coplanar with the remaining ones of said plurality of magnetic field gradients.

6. The method of claim 2 further comprising the step of applying, prior to said step of irradiating to produce a spin echo, at least one phase-encoding magnetic field gradient having one of a plurality of amplitude and duration products for phase encoding spatial information into said spin-echo signal in the course of implementing said plurality of views.

7. The method of claim 6 wherein said spin-echo signal is sampled in the presence of a substantially linear magnetic field gradient, which gradient is perpendicular to the direction of said phase-encoding magnetic field gradient within said region.

8. The method of claim 7 further comprising the step of applying an additional phase-encoding magnetic field gradient selected to be orthogonal to said one phase-encoding magnetic field gradient, said additional phase-encoding gradient having a plurality of amplitude and duration products; and
  holding the amplitude and duration product of one of said phase-encoding gradients constant, while sequencing through all of the amplitude and duration product of the other phase-encoding gradient, prior to advancing to the amplitude and duration product of said one gradient.

9. A method of compensating for random phase accumulations in magnetic resonance signals acquired from a region of an object having stationary and flowing nuclear spins, said method including the implementation of a plurality of views, each of which includes irradiation of said region by an RF excitation pulse at the Larmor frequency to produce an NMR signal, and application of a pulsed magnetic field gradient having adjustable amplitude and duration parameters along at least one dimensional axis of said region, said random phase accumulations being due to fluctuations of flow velocity of said flowing spins from view to view, said method comprising the steps:

(a) selectively exciting nuclear spins in said region in the presence of a first gradient applied along a first dimensional axis of said region so as to produce a spin-echo signal;

(b) applying a phase-encoding magnetic field gradient along a second dimensional axis of said region to encode into said spin-echo signal spatial information in the direction of said second axis;

(c) observing said spin echo signal in the presence of a readout magnetic field gradient applied along a third dimensional axis of said region orthogonal to said third axis, to encode spatial information along said third axis; and (d) modifying at least one of said amplitude and duration parameters of at least one of said first, second and third magnetic field gradients so as to make at least one of the higher moments of said one magnetic field gradient equal zero by satisfying for said flowing nuclear spins the equation:

$$\gamma v_\alpha \int_o^{TE} G_\alpha(t') \, t' \, dt' = 0$$

where $\alpha = x, y,$ or $z$,
  $v$ is the velocity of nuclear spin flow in the direction of $\alpha$,
  TE is the time occurrence of the spin-echo signal,
  $G_\alpha$ is the gradient in the $\alpha$ direction, and
  $\gamma$ is the gyromagnetic ratio.

* * * * *

UNITED STATES PATENT AND TRADEMARK OFFICE
CERTIFICATE OF CORRECTION

PATENT NO. : 4,731,583

DATED : March 15, 1988

INVENTOR(S) : Gary H. Glover and Matthew O'Donnell

It is certified that error appears in the above-identified patent and that said Letters Patent is hereby corrected as shown below:

Col. 5, line 58, Equation (5), change "y'" to -- y --.

Col. 9, line 15, after "the", second occurrence, insert -- $\alpha$ --.

Signed and Sealed this

Fourth Day of July, 1989

Attest:

DONALD J. QUIGG

*Attesting Officer*   *Commissioner of Patents and Trademarks*